(12) United States Patent
Shimase et al.

(10) Patent No.: US 12,347,718 B2
(45) Date of Patent: Jul. 1, 2025

(54) WAFER CONVEYANCE UNIT AND WAFER CONVEYANCE METHOD

(71) Applicant: HAMAMATSU PHOTONICS K.K., Hamamatsu (JP)

(72) Inventors: Akira Shimase, Hamamatsu (JP); Toshimichi Ishizuka, Hamamatsu (JP); Masataka Ikesu, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 415 days.

(21) Appl. No.: 17/772,596

(22) PCT Filed: Nov. 9, 2020

(86) PCT No.: PCT/JP2020/041755
§ 371 (c)(1),
(2) Date: Apr. 28, 2022

(87) PCT Pub. No.: WO2021/149330
PCT Pub. Date: Jul. 29, 2021

(65) Prior Publication Data
US 2022/0406644 A1 Dec. 22, 2022

(30) Foreign Application Priority Data
Jan. 23, 2020 (JP) .................................. 2020-009273

(51) Int. Cl.
*H01L 21/687* (2006.01)
*H01L 21/67* (2006.01)
*H01L 21/677* (2006.01)

(52) U.S. Cl.
CPC .. *H01L 21/68728* (2013.01); *H01L 21/67288* (2013.01); *H01L 21/67706* (2013.01); *H01L 21/68721* (2013.01)

(58) Field of Classification Search
None
See application file for complete search history.

(56) References Cited

U.S. PATENT DOCUMENTS 7,281,741 B2 * 10/2007 Woodruff .......... H01L 21/67259
414/744.8
11,338,448 B2 * 5/2022 Fukushima .............. B25J 15/00
(Continued)

FOREIGN PATENT DOCUMENTS

JP 2008-305905 A 12/2008
JP 2011-119348 A 6/2011
(Continued)

OTHER PUBLICATIONS

English-language translation of International Preliminary Report on Patentability (IPRP) dated Aug. 4, 2022 that issued in WO Patent Application No. PCT/JP2020/041755.

*Primary Examiner* — Michael S Lowe
(74) *Attorney, Agent, or Firm* — Faegre Drinker Biddle & Reath LLP

(57) ABSTRACT

A failure analysis unit is a wafer conveyance unit configured to convey a wafer while holding the wafer in a semiconductor failure analysis apparatus, the wafer conveyance unit including: a placement table configured to fix a wafer at a predetermined observation position; and a wafer chuck configured to convey the wafer while holding the wafer to the observation position. The wafer chuck includes a plurality of holding members (protruding portions) provided so as to face a side surface of the wafer, and holds the wafer by sandwiching a peripheral portion of the wafer W with the plurality of holding members.

6 Claims, 18 Drawing Sheets

(56) References Cited

U.S. PATENT DOCUMENTS

| | | |
|---|---|---|
| 2006/0245856 A1 | 11/2006 | Sundar et al. |
| 2010/0132742 A1 | 6/2010 | Tomita et al. |
| 2010/0315617 A1 | 12/2010 | Chua et al. |
| 2018/0161989 A1 | 6/2018 | Bosboom et al. |

FOREIGN PATENT DOCUMENTS

| | | |
|---|---|---|
| JP | 2018-111200 A | 7/2018 |
| JP | 2018-170418 A | 11/2018 |
| KR | 10-2019-0083986 A | 7/2019 |
| WO | WO-2006/057050 A1 | 6/2006 |

\* cited by examiner

WAFER CONVEYANCE UNIT AND WAFER CONVEYANCE METHOD

TECHNICAL FIELD

One aspect of the present invention relates to a wafer conveyance unit and a wafer conveyance method for conveying a wafer while holding the wafer in a semiconductor failure analysis apparatus.

BACKGROUND ART

In a semiconductor failure analysis apparatus, a mechanism (wafer conveyance mechanism) that conveys a wafer while holding the wafer is known (see, for example, Patent Literature 1).

CITATION LIST

Patent Literature

Patent Literature 1: U.S. Unexamined Patent Application Publication No. 2010/0315617

SUMMARY OF INVENTION

Technical Problem

As a wafer conveyance mechanism as described above, a configuration including a wafer chuck on which a wafer is placed and conveyed is known. Conventionally, as a method for firmly holding a wafer on a wafer chuck, there is a method of fixing a wafer to a wafer chuck with a tape. In recent years, there has been a case where a wafer is moved from a wafer cassette to a wafer chuck by a wafer conveyance robot in order to automatically perform failure analysis on a plurality of wafers. However, when such a wafer conveyance robot is used, it is difficult to adopt a method of fixing a wafer to a wafer chuck with a tape. Therefore, it is required to firmly hold a wafer during conveyance by a method other than fixing with a tape.

In addition, in the semiconductor failure analysis apparatus as described above, in a state in which the wafer is held by a wafer chuck or the like, a special lens called a solid immersion lens mounting a hemispherical member on the tip is brought into close contact with the back surface side of the wafer to acquire a high-resolution image in some cases. In order to analyze any chip in the wafer by bringing the solid immersion lens into close contact with the wafer, the entire back surface of the wafer needs to be exposed. Therefore, in the configuration in which the solid immersion lens is brought into close contact with the back surface side of the wafer, it is necessary to provide a configuration for firmly holding the wafer during conveyance at a position other than the back surface side of the wafer.

Furthermore, in the semiconductor failure analysis apparatus as described above, a needle of the probe card is touched down on the pad of the wafer from the front surface side of the wafer and a bias is applied to the wafer. When a fixture that firmly holds the wafer during conveyance is provided on the front surface side of the wafer, there is a possibility that the fixture interferes with the touch down processing of the needle of the probe card or damages the needle of the probe card. As described above, in the wafer conveyance mechanism, it is required to firmly hold the wafer during conveyance by a method other than the tape, but when each function of the semiconductor failure analysis apparatus is to be achieved, the position, thickness, and the like of the holding means are limited, and an appropriate holding means has not been found.

An aspect of the present invention has been made in view of the above circumstances, and an object of the present invention is to provide a wafer conveyance unit and a wafer conveyance method capable of appropriately holding a wafer during conveyance without hindering each function of a semiconductor failure analysis apparatus.

Solution to Problem

A wafer conveyance unit according to one aspect of the present invention is a wafer conveyance unit configured to convey a wafer while holding the wafer in a semiconductor failure analysis apparatus, the wafer conveyance unit including: a fixing unit configured to fix a wafer at a predetermined observation position; and a conveyance unit configured to convey the wafer to the observation position while holding the wafer. The conveyance unit includes a plurality of holding members provided so as to face a side surface of the wafer, and holds the wafer by sandwiching a peripheral portion of the wafer with the plurality of holding members.

In the wafer conveyance unit according to one aspect of the present invention, the wafer is conveyed by the conveyance unit to the observation position where the wafer is fixed. Then, the conveyance unit sandwiches the peripheral portion of the wafer with a plurality of holding members provided to face the side surface of the wafer. As described above, by adopting the configuration in which the holding member of the conveyance unit sandwiches the peripheral portion of the wafer from the side surface of the wafer, it is not necessary to provide a new configuration for firmly holding the wafer during conveyance on the back surface side and the front surface side of the wafer. This makes it possible to appropriately hold the wafer during conveyance without hindering each function of the semiconductor failure analysis apparatus.

The plurality of holding members may include at least three protruding portions configured to abut on a peripheral portion of the wafer. Thus, the wafer can be stably sandwiched.

The plurality of holding members may include at least four protruding portions. Thus, the wafer can be more stably sandwiched.

The plurality of holding members may include: a first holding member including one or a plurality of protruding portions configured to abut on a peripheral portion of the wafer, and a second holding member including one or a plurality of the protruding portions. A direction of a force applied to the wafer by the first holding member configured to sandwich the wafer and a direction of a force applied to the wafer by the second holding member configured to sandwich the wafer may be opposite to each other. Since the direction of the force applied to the wafer by the first holding member and the direction of the force applied to the wafer by the second holding member are opposite to each other, the wafer can be appropriately sandwiched by the first holding member and the second holding member.

The wafer conveyance unit described above may further include a ratchet portion configured to change a separation distance between the first holding member and the second holding member by fixing a position of only one of the first holding member and the second holding member, the ratchet portion configured to release a sandwiching state of the wafer by the first holding member and the second holding member.

According to such a configuration, with a simple configuration in which the position of only one of the first holding member and the second holding member is fixed, the sandwiching state of the wafer can be appropriately released (the wafer can be opened).

The conveyance unit may include: a base portion; a ring portion including: a first portion connected to the base portion via an elastic member, a pair of second portions continuous with the first portion and extending in a first direction while facing each other, and a third portion continuous with tips of the pair of second portions and formed in a ring shape so as to partition a housing space for housing a wafer; and a core portion continuous with the base portion and extending in a first direction between the pair of second portions. The third portion of the ring portion may be provided with the first holding member protruding toward the housing space. A tip of the core portion may be provided with the second holding member protruding toward the housing space. A hole portion configured to be engaged with the ratchet portion may be formed in the pair of second portions of the ring portion. The ratchet portion may engage with the hole portion to fix a position of the ring portion to fix a position of the first holding member. According to this configuration, the wafer is appropriately sandwiched between the first holding member and the second holding member protruding toward the housing space. Then, the hole portions of the pair of second portions of the ring portion are engaged with the ratchet portion, whereby the ring portion is fixed and the position of the first holding member is fixed. In this case, since the ring portion and the base portion are connected via the elastic member, the base portion and the core portion continuous with the base portion can be displaced even in a state where the position of the ring portion is fixed by extension of the elastic member. Displacement of the core portion in a direction away from the housing space in a state where the position of the ring portion is fixed causes the separation distance between the first holding member provided in the ring portion and the second holding member provided in the core portion to increase, and the sandwiching state of the wafer by the first holding member and the second holding member to be released. As described above, with the above-described configuration, it is possible to easily perform appropriate sandwiching and releasing (opening) of the wafer.

A wafer conveyance method according to an aspect of the present invention is a wafer conveyance method for conveying a wafer while holding the wafer in a semiconductor failure analysis apparatus, the method including: sandwiching a peripheral portion of the wafer with a plurality of holding members provided to face a side surface of the wafer; and conveying the wafer to a predetermined observation position in a state where a peripheral portion of the wafer is sandwiched by the plurality of holding members.

Advantageous Effects of Invention

According to an aspect of the present invention, it is possible to appropriately hold a wafer during conveyance without hindering each function of the semiconductor failure analysis apparatus.

DESCRIPTION OF EMBODIMENTS

Figure 1:
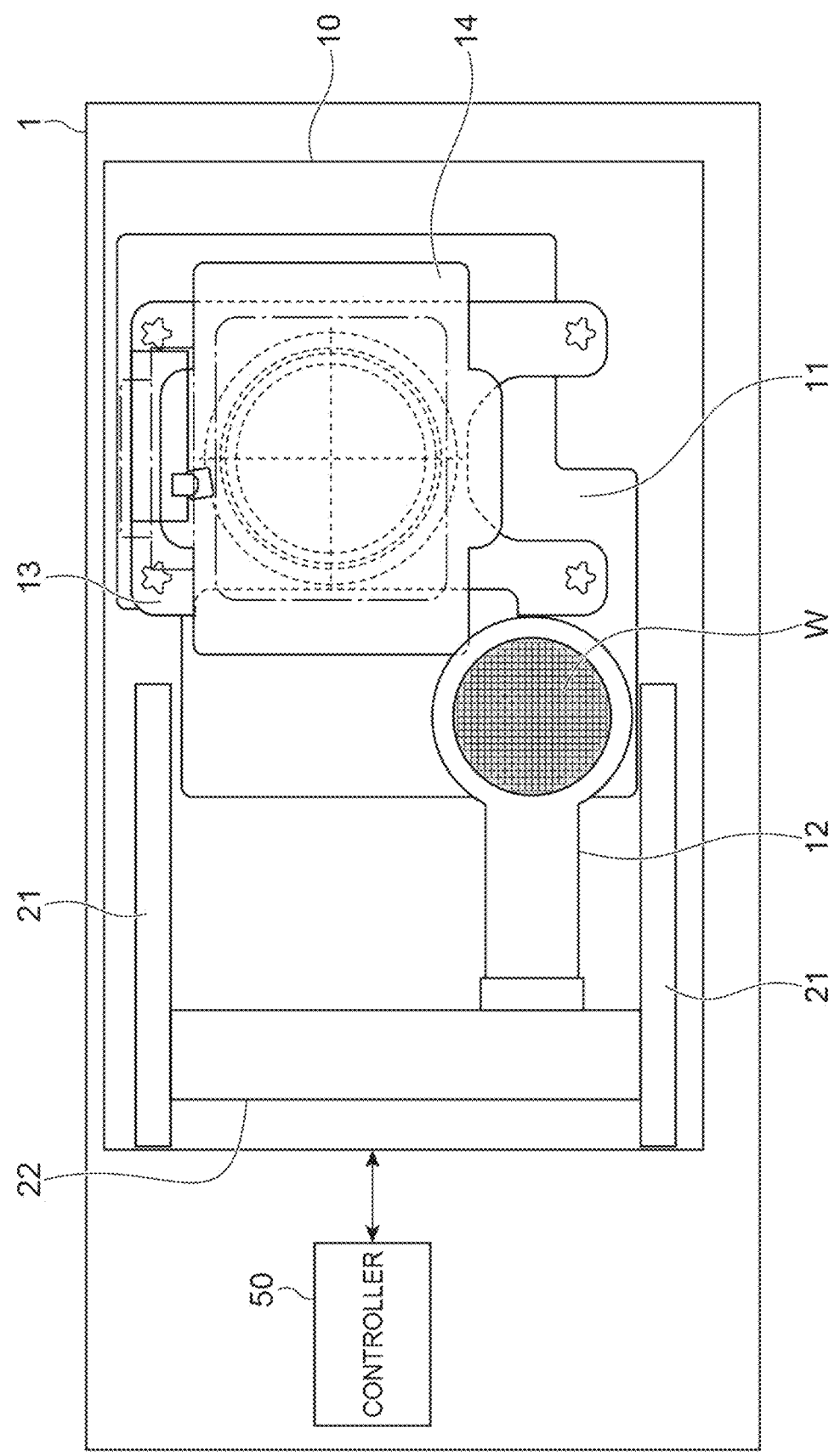
FIG. 1 is a diagram schematically showing a failure analysis apparatus according to an embodiment of the present invention.

Hereinafter, embodiments of the present invention will be described in detail with reference to the drawings. It should be noted that in each drawing, the same or corresponding parts are denoted by the same reference numerals, and redundant description will be omitted.

FIG. 1 is a diagram schematically illustrating a failure analysis apparatus 1 (semiconductor failure analysis apparatus) according to the present embodiment. The failure analysis apparatus 1 is an apparatus that inspects the wafer W (analyzes the failure of the wafer W). Chips being a plurality of semiconductor devices are formed on the wafer W. Examples of the semiconductor devices include a logic device, a memory device, an analog device, a mixed signal device in which digital and analog are mixedly placed, a discrete device including a power device s, a photo device including an optical sensor and a light emitting element, and a passive element including a capacitor and a coil.

Figure 2:
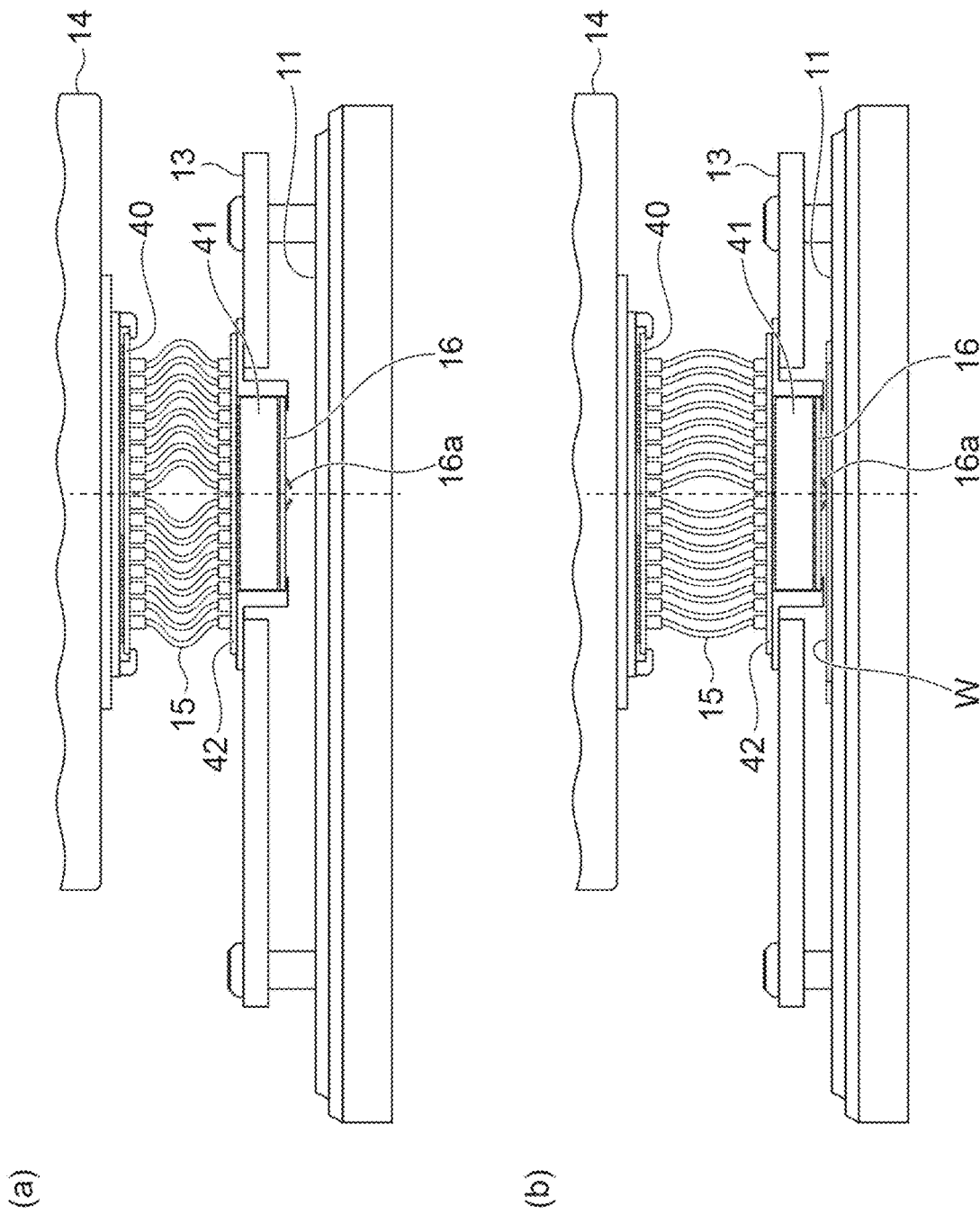
FIG. 2 is a diagram for illustrating a configuration of a wafer observation position.

As shown in FIG. 1, the failure analysis apparatus 1 includes a failure analysis unit 10 (wafer conveyance unit) and a controller 50. The controller 50 is a control unit that controls each component of the failure analysis unit 10 (details will be described below). As shown in FIGS. 1 and 2, the failure analysis unit 10 includes a placement table 11 (fixing unit), a platen 13, a test head 14, a cable 15, a probe card 16, a performance board 40, a connector board 42, and a pogo tower 41, as a configuration at an observation position where failure analysis of the wafer W is performed.

FIG. 2 is a diagram for illustrating a configuration of a wafer observation position. FIG. 2(a) shows a state in which the wafer W is not placed on the placement table 11, and FIG. 2(b) shows a state in which the wafer W is placed on the placement table 11. The placement table 11 is a fixing unit that fixes the wafer at a predetermined observation position. The platen 13 is a flat plate-shaped member that holds the probe card 16. The platen 13 is movable in the vertical direction by a Z stage (not shown) installed in a lower portion of the placement table 11. The test head 14 is configured to apply a voltage to the needle 16a of the probe card 16 via the performance board 40, the cable 15, the connector board 41, and the pogo tower 42. The probe card 16 is a jig used for electrical inspection of the chip of the wafer W. The probe card 16 includes a needle 16a protruding toward the placement table 11. As shown in FIG. 2(b), in a state in which the wafer W is fixed to the placement table 11, lowering of the platen 13 causes the needle 16a of the probe card 16 to touch down on the pad formed on the chip on the surface of the wafer W, and an appropriate voltage is applied by the test head 14, whereby the failure state of the chip is reproduced, and the failure analysis is performed on the chip to be inspected.

Figure 3:
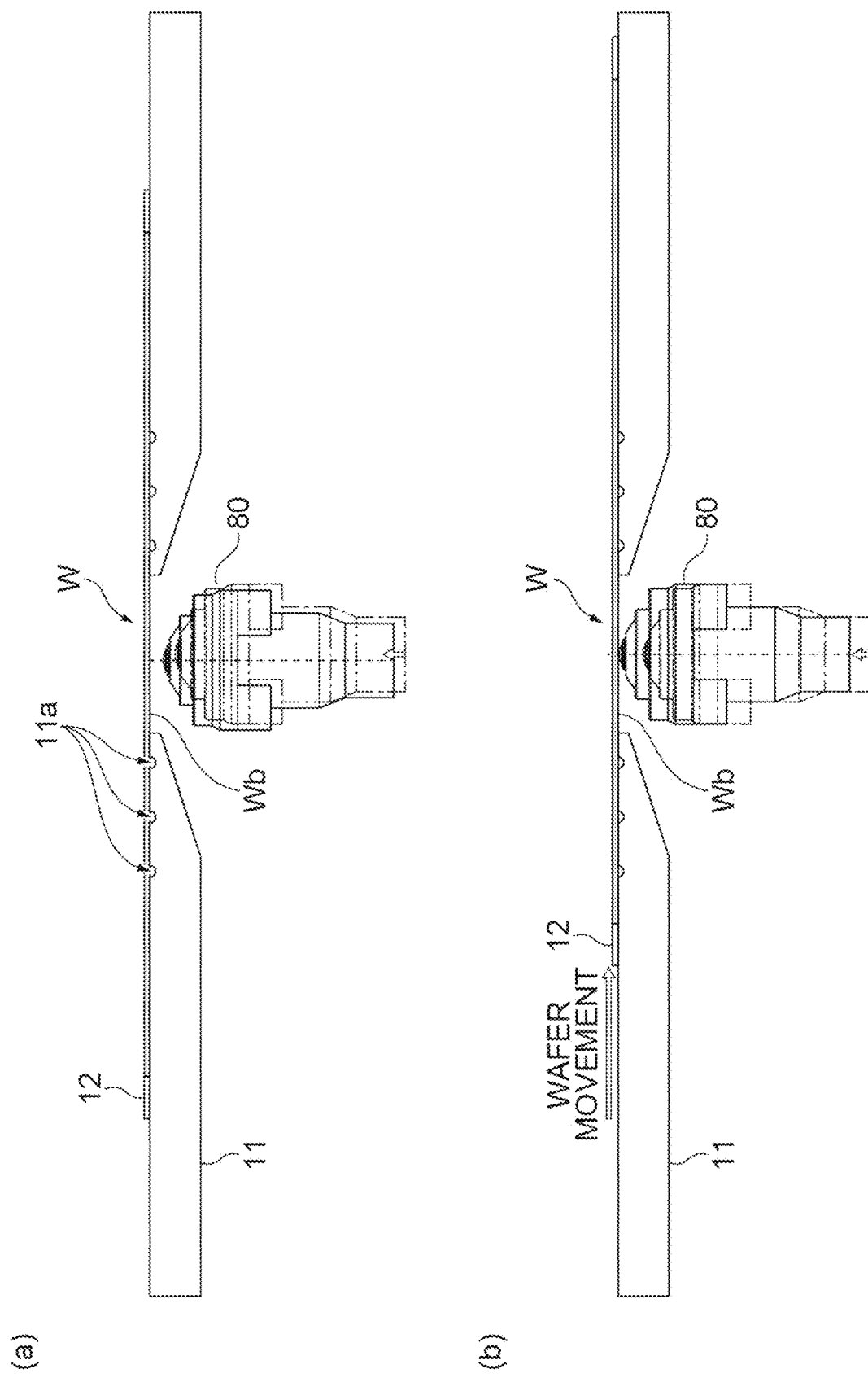
FIG. 3 is a diagram for illustrating back surface observation of the wafer.

FIG. 3 is a diagram for illustrating back surface observation of the wafer W. In the failure analysis of the wafer W at the wafer observation position, as shown in FIG. 3(a), the tip of the solid immersion lens 80 is brought into close contact with the back surface Wb of the wafer W, and a high-resolution image on the back surface Wb side of the wafer W is acquired. A plurality of wafer suction grooves 11a are formed in the placement table 11. Since the wafer suction groove 11a is formed, the wafer W is appropriately fixed to the placement table 11 by the vacuum chuck when the inspection on the back surface Wb side in the failure reproduction state by the appropriate voltage application is performed. As shown in FIG. 3(b), the wafer W is moved by the wafer chuck 12, and failure analysis is performed on any chip of the wafer W.

Returning to FIG. 1, the failure analysis unit 10 includes a wafer chuck 12 (conveyance unit), X stages 21 and 21, and a Y stage 22, as a configuration for conveying the wafer W while holding the wafer W. The X stages 21 and 21 are stages for moving the wafer chuck 12 holding the wafer W in the X direction (first direction). The Y stage 22 is a stage for moving the wafer chuck 12 holding the wafer W in the Y direction. The X direction and the Y direction are directions along the placement surface of the wafer W in the wafer chuck 12, and are directions intersecting each other. As shown in FIG. 1, in the present embodiment, since the wafer chuck 12 moves in the X direction along the X stages 21 and 21, the separation distance between the wafer chuck 12 and the placement table 11 of the failure analysis unit 10 changes. The X stages 21 and 21 extend in the X direction so as to face each other. The Y stage 22 is built between the X stages 21 and 21, and is provided to be movable in the X direction along the X stages 21 and 21. The wafer chuck 12 is provided to be movable in the Y direction along the Y stage 22. According to this configuration, movement of the Y stage 22 along the X stages 21 and 21 causes the wafer chuck 12 to move in the X direction.

The wafer chuck 12 is a conveyance unit that conveys the wafer W while holding the wafer W to the placement table 11 being the observation position. As described above, the wafer chuck 12 is movable in the X direction and the Y direction (the direction along the placement surface of the wafer W in the wafer chuck 12) by the X stages 21 and 21 and the Y stage 22. The wafer chuck 12 sequentially conveys a plurality of wafers W to be automatically replaced by, for example, the wafer conveyance robot 60 (see FIG. 4) to the placement table 11.

Figure 4:
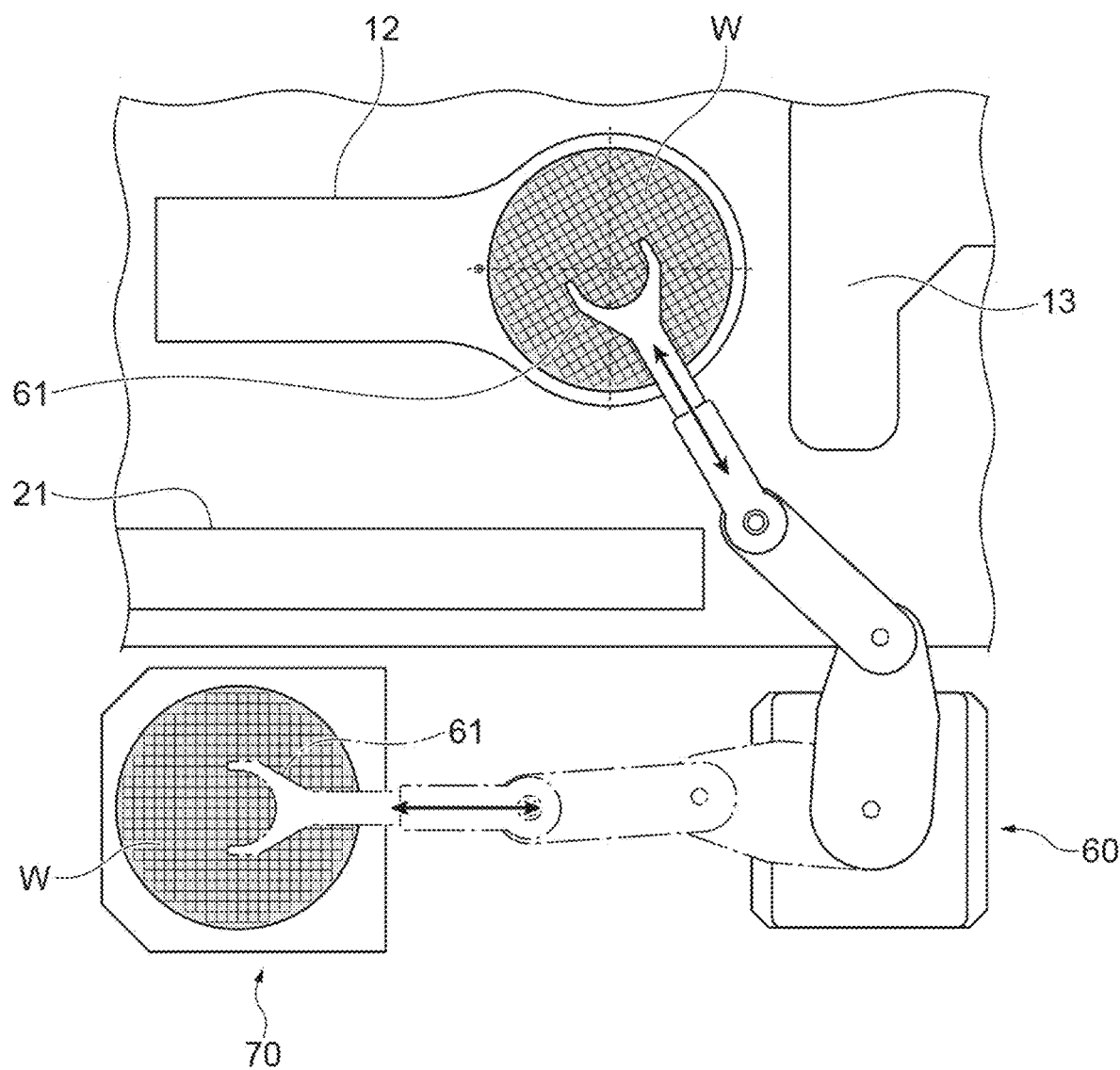
FIG. 4 is a diagram for illustrating wafer replacement by the wafer conveyance robot.

FIG. 4 is a diagram for illustrating wafer replacement by the wafer conveyance robot 60. FIG. 4 illustrates a wafer conveyance robot 60 and a wafer cassette 70 as a configuration related to wafer replacement. As shown in FIG. 4, in the wafer cassette 70, a plurality of wafers W to be failure-analyzed are divided by partitions and stacked in a state of being placed on each partition. The wafer conveyance robot 60 lifts and sucks one of the wafers W from the wafer cassette 70 by the hand 61 from the back surface to move and deliver the wafer W to the wafer chuck 12. At this time, the wafer conveyance robot 60 may deliver the wafer W to the wafer chuck 12 via a wafer holder 19 and a wafer base 51 (see FIG. 9) described below. The wafer chuck 12 conveys the wafer W to the placement table 11 while holding the wafer W by a holding member described below, and conveys the wafer W to the vicinity of the wafer conveyance robot 60 when failure analysis of the wafer W on the placement table 11 is completed. Then, the wafer conveyance robot 60 takes out the wafer W whose failure analysis has been completed from the wafer chuck 12, holds and conveys the next wafer W stacked on the wafer cassette 70, and places the wafer W on the placement surface of the wafer chuck 12. The wafer replacement by the wafer conveyance robot 60 has been described above.

Figure 8:
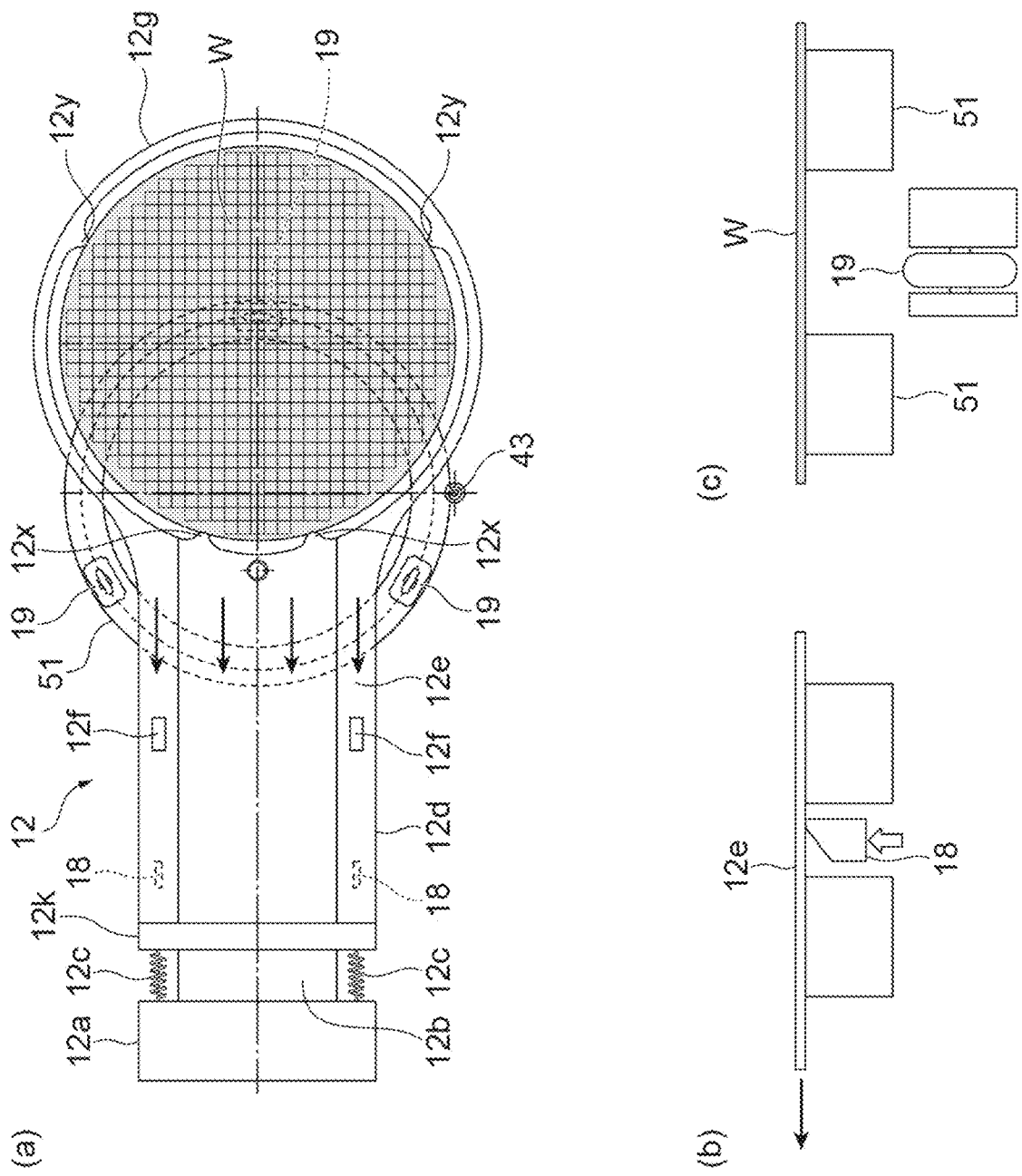
FIG. 8 is a diagram for illustrating a wafer conveyance step by the wafer chuck.
Figure 9:
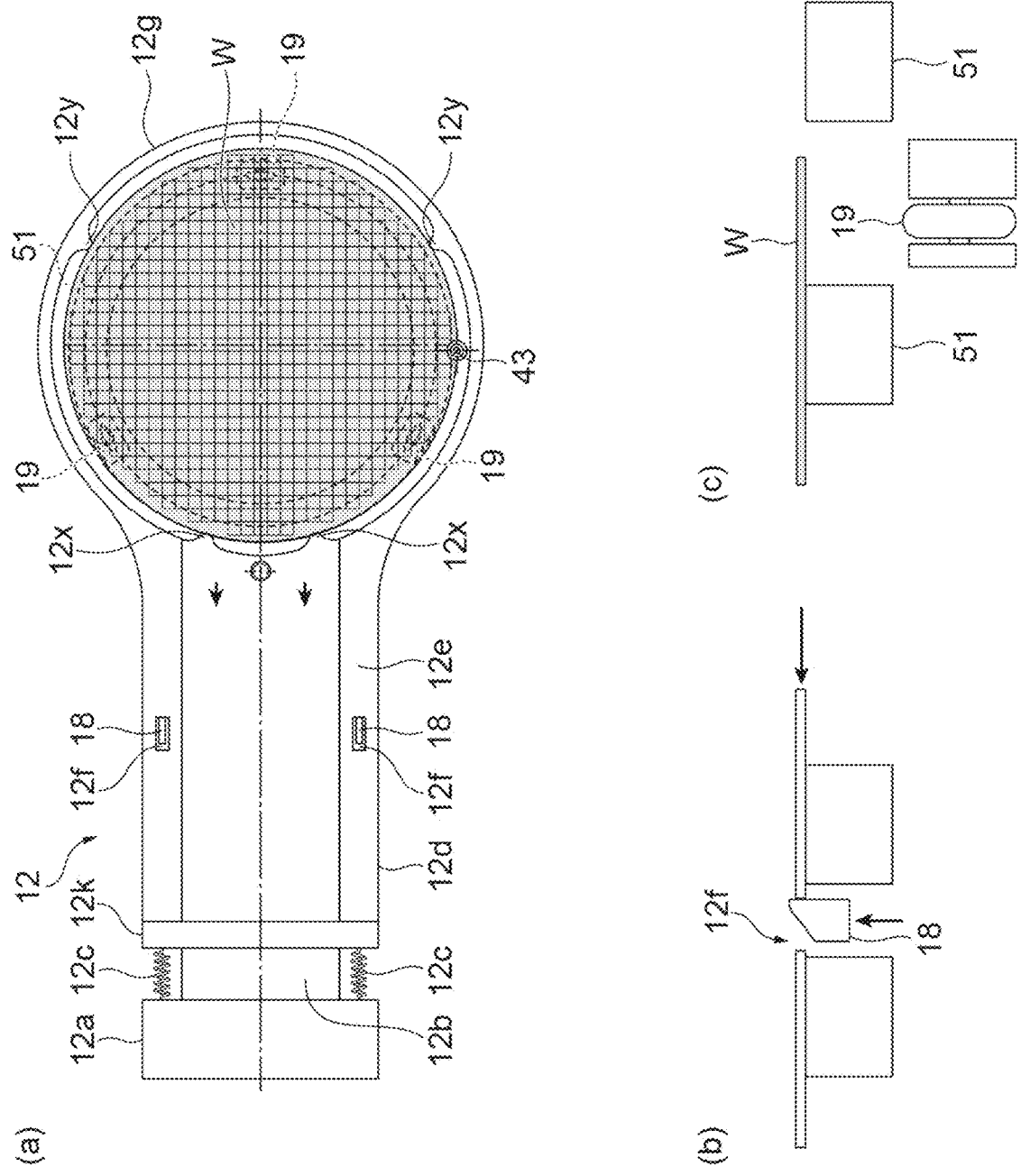
FIG. 9 is a diagram for illustrating a wafer conveyance step by the wafer chuck.

As shown in FIGS. 8, 9, and the like, a wafer base 51 and a wafer holder 19 are provided near the wafer replacement place where the wafer conveyance robot 60 and the wafer cassette 70 are provided. The wafer base 51 is a placement table on which the wafer W is placed at the time of wafer replacement. The wafer base 51 may be set at the same height as the placement table 11 in order to slide and move the wafer W. In addition, a configuration may be used where the wafer holder 19 is simply disposed in the placement table 11 instead of the configuration including the wafer base 51 and the wafer holder 19. The wafer holder 19 is configured to be vertically movable, and pushes up the wafer W placed on the wafer base 51 from the back surface side to deliver the wafer W to and from the wafer conveyance robot 60 (details will be described below).

Figure 5:
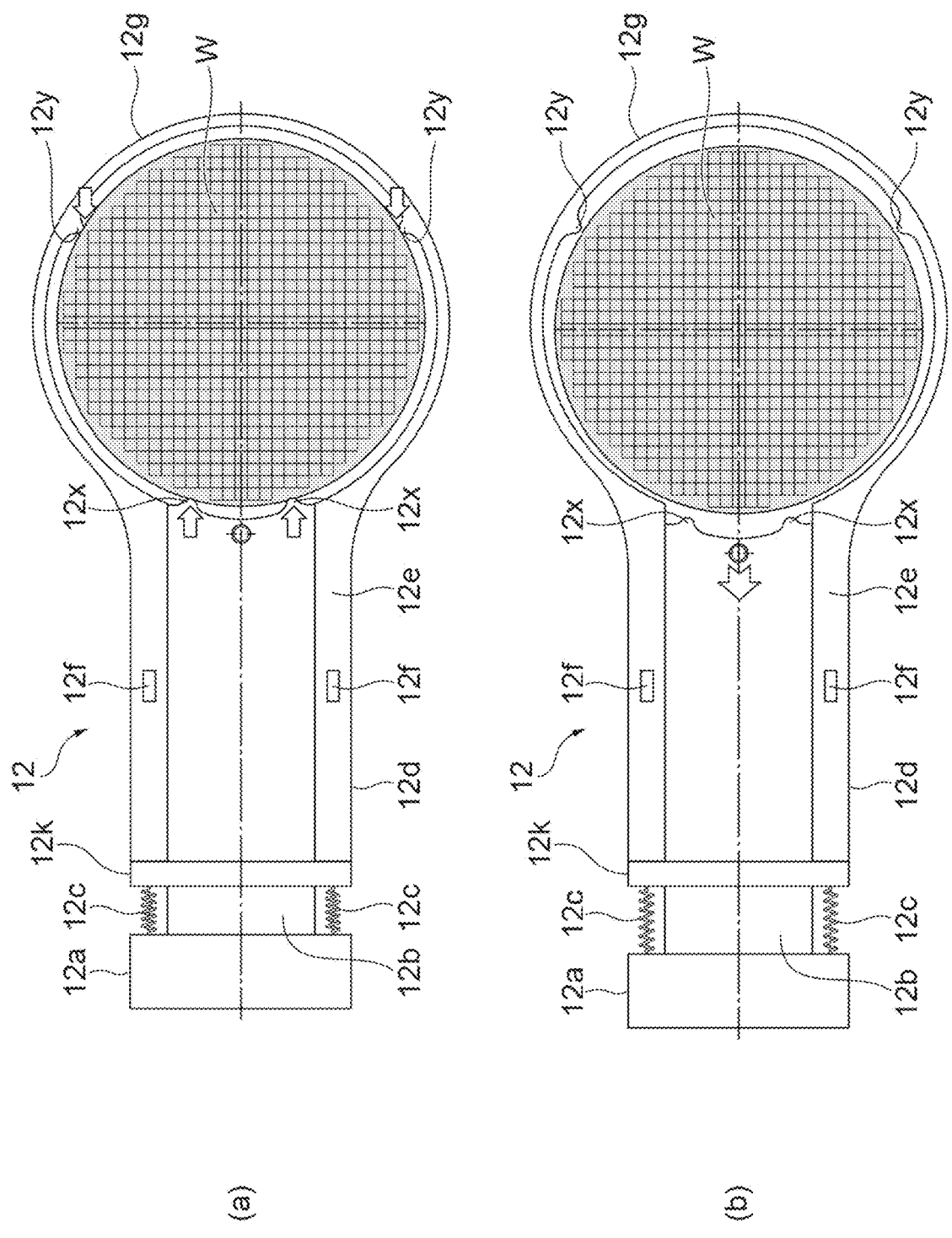
FIG. 5 is a diagram for illustrating a wafer holding state and a wafer release state by a wafer chuck.

A configuration related to holding of the wafer W by the wafer chuck 12 will be described with reference to FIG. 5. FIG. 5 is a diagram for illustrating a wafer holding state (FIG. 5(a)) and a wafer release state (FIG. 5(b)) by the wafer chuck 12. The wafer chuck 12 includes a plurality of holding members provided so as to face the side surface of the wafer W. The plurality of holding members include four protruding portions 12x, 12x, 12y, and 12y. The protruding portions 12x, 12x, 12y, and 12y are configured to sandwich the wafer W. Specifically, the plurality of holding members include a first holding member including two protruding portions 12y and 12y that abut on the peripheral portion of the wafer W, and a second holding member including two protruding portions 12x and 12x.

The wafer chuck 12 includes a base portion 12a, a core portion 12b, an elastic member 12c, and a ring portion 12d. The base portion 12a is a portion connected to the Y stage 22. The ring portion 12d includes a first portion 12k connected to the base portion 12a via a pair of elastic members 12c and 12c, a pair of second portions 12e and 12e continuous with the first portion 12k and extending in the X direction (first direction) while facing each other, and a third portion 12g continuous with tips of the pair of second portions 12e (end portions opposite to the side continuous with the first portion 12k in the X direction) and formed in a ring shape so as to partition a substantially circular housing space in a plan view for housing (placing) the wafer W.

Figure 10:
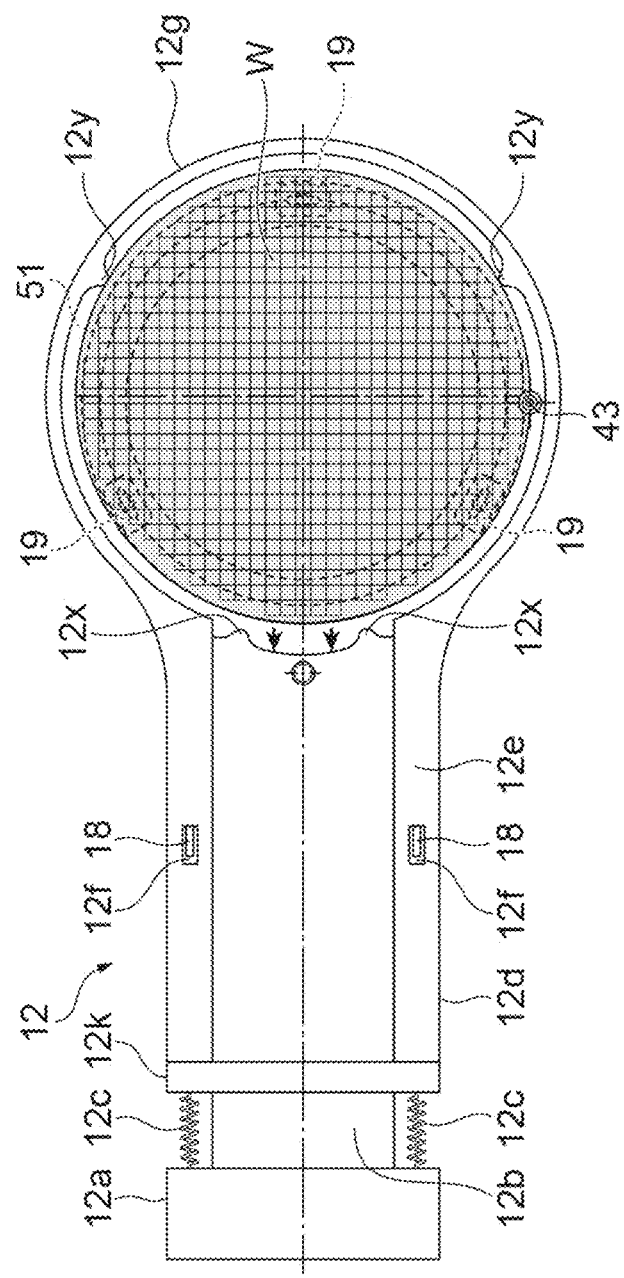
FIG. 10 is a diagram for illustrating a wafer conveyance step by the wafer chuck.

In the pair of second portions 12e and 12e, hole portions 12f and 12f configured to be engageable with ratchet mechanisms 18 (ratchet portion, see FIG. 9). The ratchet mechanisms 18 and 18 fix the positions of the second portions 12e and 12e in which the hole portions 12f and 12f are formed by engaging with the hole portions 12f and 12f The ratchet mechanism 18 is configured to fix the positions of the protruding portions 12y and 12y being the first holding members by fixing the positions of the second portions 12e and 12e, change the separation distance between the protruding portions 12y and 12y and the protruding portions 12x and 12x, and release the sandwiching state of the wafer W by the protruding portions 12y and 12y and the protruding portions 12x and 12x (details will be described below). That is, in a state where engagement of the ratchet mechanism 18 with the second portion 12e fixes the positions of the ring portion 12d (that is, the positions of the protruding portions 12y and 12y), only the core portion 12b moves in the X direction (and the direction separated from the wafer W) as shown in FIG. 10, whereby the distance between the protruding portions 12y and 12y and the protruding portions 12x and 12x is increased, the protruding portions 12x and 12x are not in contact with the wafer W, and the sandwiching state of the wafer W is released.

The elastic member 12c may be a spring member having elasticity, or may be rubber (such as a rubber band of silicone rubber). The core portion 12b is continuous with the base portion 12a and extends in the X direction (first direction) between the pair of second portions 12e and 12e. Protruding portions 12x and 12x being second holding members protruding toward the housing space where the wafer W is placed (housed) are provided at the tip of the core portion 12b (the end portion opposite to the side continuous with the base portion 12a in the X direction). In addition, the third portion 12g of the ring portion 12d is provided with the protruding portions 12y and 12y being the first holding members protruding toward a substantially circular housing space in a plan view for housing (placing) the wafer W. As shown in FIG. 5(a), the direction of the force applied to the wafer W by the protruding portions 12x and 12x being the second holding members that sandwich the wafer W and the direction of the force applied to the wafer W by the protruding portions 12y and 12y being the first holding members that sandwich the wafer W are opposite to each other in the X direction. The positions where the protruding portions 12x, 12x, 12y, and 12y are provided are not particularly limited, but for example, the positions where the protruding portions 12y and 12y are provided are outside the positions where the protruding portions 12x and 12x are provided in the Y direction.

As shown in FIG. 5(a), in the wafer holding state, the wafer chuck 12 holds the wafer W by sandwiching the peripheral portion of the wafer W by the protruding portions 12x and 12x being the second holding members and the protruding portions 12y and 12y being the first holding members. In addition, as shown in FIG. 5(b), in the wafer release state, in the wafer chuck 12, the protruding portions 12x and 12x being the second holding members and the protruding portions 12y and 12y being the first holding members are not in contact with the wafer W and do not sandwich the wafer W.

Figure 6:
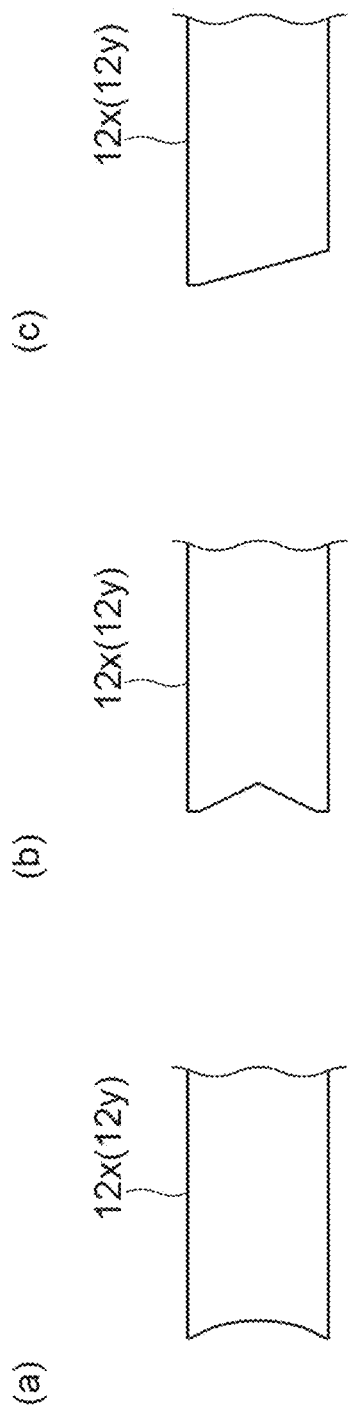
FIG. 6 is a diagram schematically showing an example of a shape of a protruding portion.

The detailed configuration of the protruding portion 12x (and the protruding portion 12y) will be described with reference to FIGS. 6 and 7. FIG. 6 is a diagram schematically showing an example of a shape of the protruding portion 12x (and the protruding portion 12y) being a holding member. Each of the protruding portions 12x shown in FIGS. 6(a) and 6(b) has a shape that sandwiches the wafer W to be sandwiched, and has a shape in which the closer to the center, the more recessed. In the protruding portion 12x shown in FIG. 6(a), the surface of a portion for sandwiching the wafer W is a curved surface. On the other hand, in the protruding portion 12x shown in FIG. 6(b), the surface of a portion for sandwiching the wafer W is not a curved surface, and the central portion is formed in a recessed valley shape. The protruding portion 12x shown in FIG. 6(c) has a shape that presses the wafer W downward.

Figure 7:
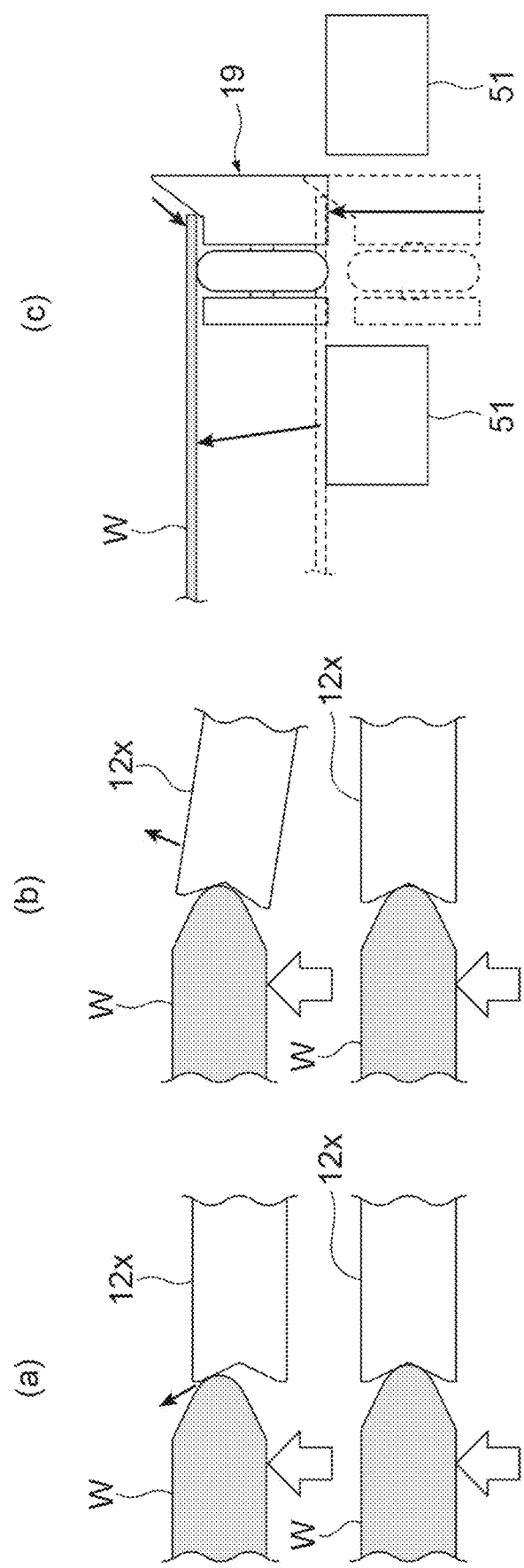
FIG. 7 is a diagram schematically showing an example of a contact structure between the wafer and the protruding portion and a contact structure between the wafer and the wafer holder.

FIG. 7 is a diagram schematically showing an example of a contact structure between the wafer W and the protruding portion 12x (FIGS. 7(a) and 7(b)) and an example of a contact structure between the wafer W and the wafer holder 19 (FIG. 7(c)). As described below, when the wafer W is taken out from the wafer chuck 12, the wafer W is lifted by the wafer holder 19 from below. In this case, as shown in FIG. 7(a), the wafer W may slide and ascend on the slope of the protruding portion 12x of the wafer chuck 12. Even when it is difficult to slide and ascend as described above, for example, as shown in FIG. 7(b), the protruding portion 12x of the wafer chuck 12 is distorted with the ascent of the wafer W (distorted in a direction in which the wafer W is likely to ascend), so that the wafer W can be appropriately taken out from the wafer chuck 12. In this case, the protruding portion 12x is made of a material having certain plasticity. It should be noted that as shown in FIG. 7(c), the wafer W may be easily taken out by providing a slope on the wafer holder 19 and sliding the wafer W to actively shift the wafer W.

Returning to FIG. 1, the controller 50 is a computer, and physically includes a memory such as a RAM and a ROM, a processor (arithmetic circuit) such as a CPU, a communication interface, and a storage unit such as a hard disk. Examples of the controller 50 include a personal computer, a cloud server, and a smart device (smartphone, tablet terminal, or the like). The controller 50 functions by causing the CPU of the computer system to execute a program stored in the memory. The controller 50 controls the X stage 21, the Y stage 22, the Z stage (not shown), and the like. The controller 50 controls the X stage 21 and the Y stage 22 to switch between the wafer holding state and the wafer release state and to convey the wafer W.

Next, a wafer conveyance step by the wafer chuck 12 will be described with reference to FIGS. 8 to 16. FIGS. 8 to 16 show consecutive steps. FIGS. 8 to 11 show, for example, steps of conveying a wafer W after failure analysis to a wafer replacement place (near the wafer conveyance robot 60), FIG. 12 shows a step of wafer replacement by the wafer conveyance robot 60, and FIGS. 13 to 16 show steps of conveying a new wafer W to the placement table 11. It should be noted that in each figure of FIGS. 8 to 16, (a) to (c) (or (a) to (b)) of the same figure numbers indicate states at the same timing. It should be noted that in the following description, the X direction indicates the right direction in the figure (direction from the placement table 11 toward the wafer base 51), and the −X direction indicates the left direction in the figure (direction opposite to the direction from the placement table 11 toward the wafer base 51).

As shown in FIG. 8(a), the wafer chuck 12 holding the wafer W is now moved in the −X direction by the control over the X stage 21 of the controller 50. It should be noted that as a premise, by the control over the Y stage 22 of the controller 50, the positions in the Y direction of the ratchet mechanisms 18 and 18 provided near the wafer replacement place and the positions in the Y direction of the hole portions 12*f* and 12*f* of the wafer chuck 12 coincide with each other. In the state shown in FIG. 8(*a*), the positions in the X direction of the hole portions 12*f* and 12*f* of the wafer chuck 12 do not reach the positions in the X direction of the ratchet mechanisms 18 and 18. As shown in FIG. 8(*b*), while a force in the upward direction is applied to the ratchet mechanism 18 by a spring force, the force in the upward direction of the ratchet mechanism 18 is suppressed by the back surface of the second portion 12*e* before the hole portion 12*f* reaches the ratchet mechanism 18. In addition, as shown in FIG. 8(*c*), in the state in FIG. 8(*a*), a part of the wafer W is already placed on a part of the wafer base 51.

When the wafer chuck 12 further moves in the −X direction from here, as shown in FIG. 9(*a*), the wafer W is placed on the wafer base 51 so that the center of the wafer base 51 coincides with the center of the wafer W, and the ratchet mechanisms 18 and 18 are engaged with the hole portions 12*f* and 12*f* of the wafer chuck 12 (see FIG. 9(*b*)). By the spring mechanism, the ratchet mechanism 18 passes through the hole portion 12*f* and protrudes upward, thereby inhibiting the movement in the −X direction of the ring portion 12*d*. In a state where the ratchet mechanism 18 and the hole portion 12*f* are engaged, the position of the ring portion 12*d* is fixed, and the position of the configuration related to the ring portion 12*d* (including protruding portions 12*y* and 12*y*) does not change. Thereafter, when the wafer chuck 12 moves in the same direction, only the base portion 12*a* and the core portion 12*b* move in the same direction, and the position of the ring portion 12*d* does not change. Such a difference in position between the base portion 12*a* and core portion 12*b* and the ring portion 12*d* is absorbed by the elastic member 12*c* extending and contracting.

As shown in FIG. 10, when the base portion 12*a* and the core portion 12*b* further move in the same −X direction, the protruding portions 12*x* and 12*x* provided at the tip of the core portion 12*b* are separated from the wafer W, and the sandwiching state of the wafer W is released. Under the control over the X stage 21 of the controller 50, the core portion 12*b* moves to a position where a space larger than the overhang inner diameters of the protruding portions 12*x* and 12*x* is opened and stops.

Figure 11:
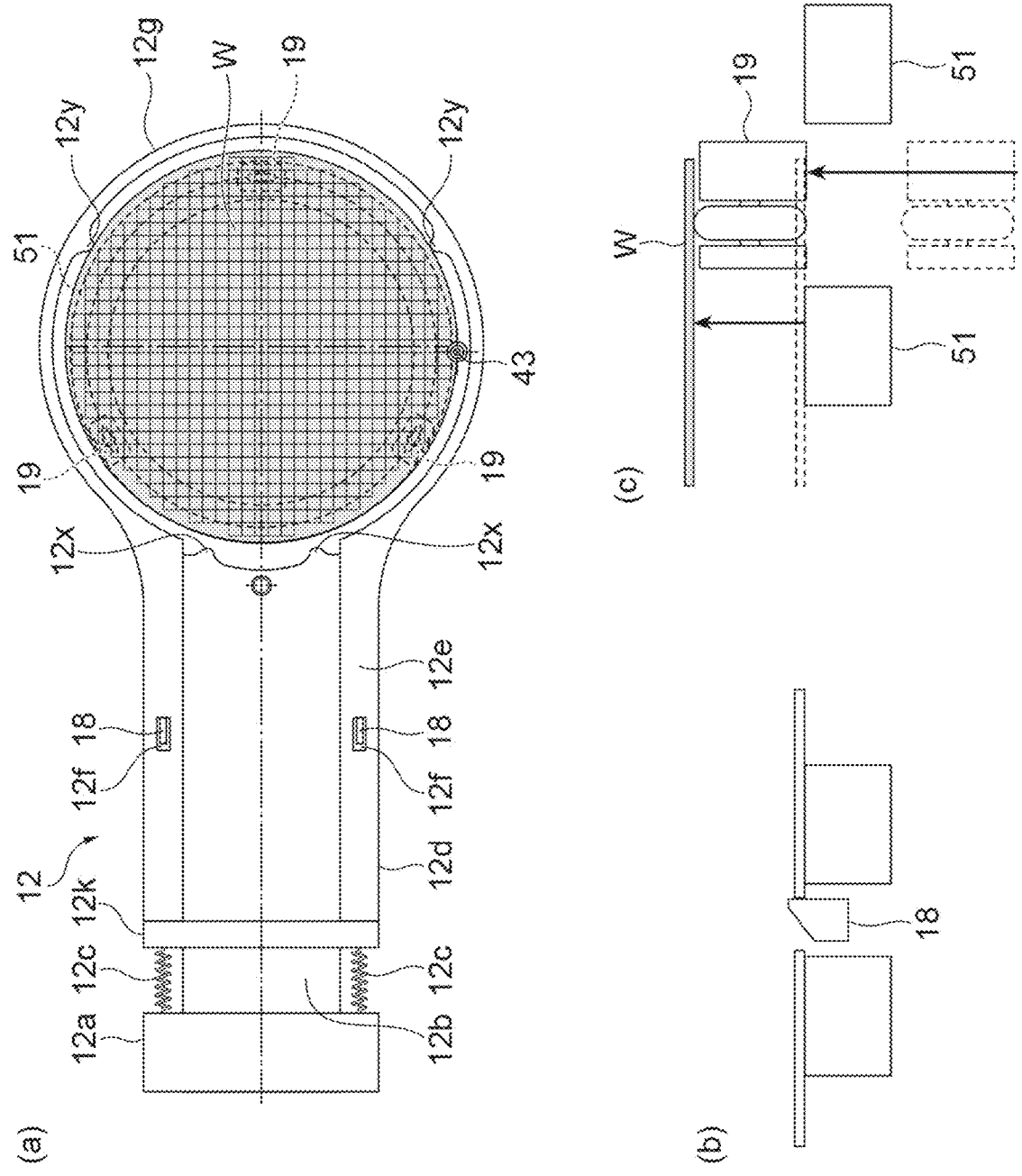
FIG. 11 is a diagram for illustrating a wafer conveyance step by the wafer chuck.
Figure 12:
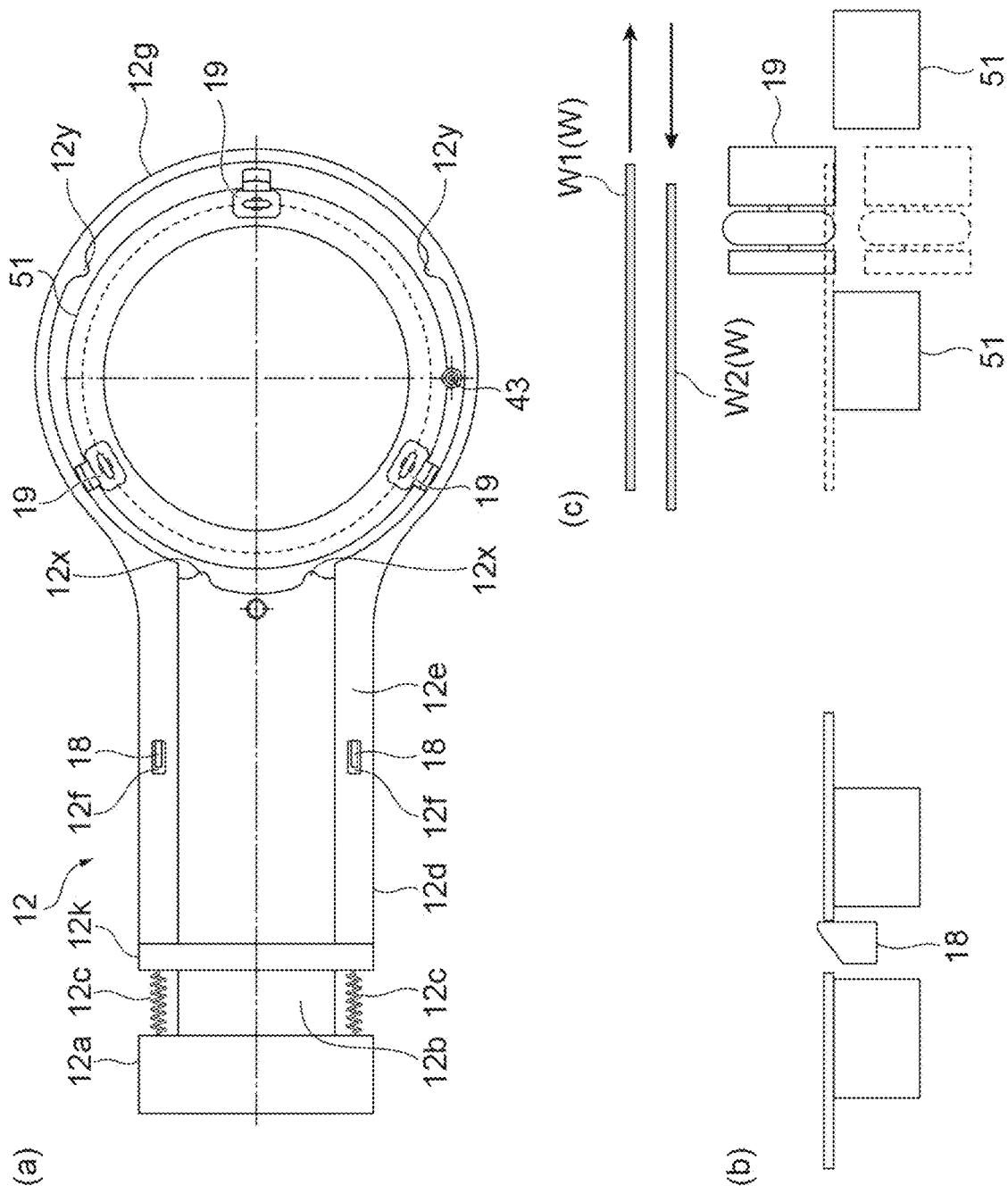
FIG. 12 is a diagram for illustrating a wafer conveyance step by the wafer chuck.

Subsequently, as shown in FIG. 11(*c*), under the control of the controller 50, the wafer holder 19 ascends to push up the wafer W from the back surface side. The ascent of the wafer holder 19 causes the wafer W to slide due to the slope of the wafer holder 19, and the wafer W can be placed at a position where the center of the wafer holder 19 and the center of the wafer W coincide with each other.

Subsequently, as shown in FIG. 12(*c*), in a state where the wafer holder 19 is raised, under the control over the wafer conveyance robot 60 of the controller 50, unloading (removal) of the wafer W1 being the wafer W after failure analysis is performed, and subsequently loading of the wafer W2 being the wafer W before failure analysis is performed. It should be noted that when the wafer W2 is loaded, for example, the notch sensor 43 identifies the position of the notch of the wafer W2, the inclination of the wafer W2 is adjusted, and the wafer W2 is set at a correct angle. FIG. 12(*a*) shows the wafer chuck 12, the wafer base 51, and the wafer holder 19 in a state where the wafer W (wafer W1) is unloaded.

Figure 13:
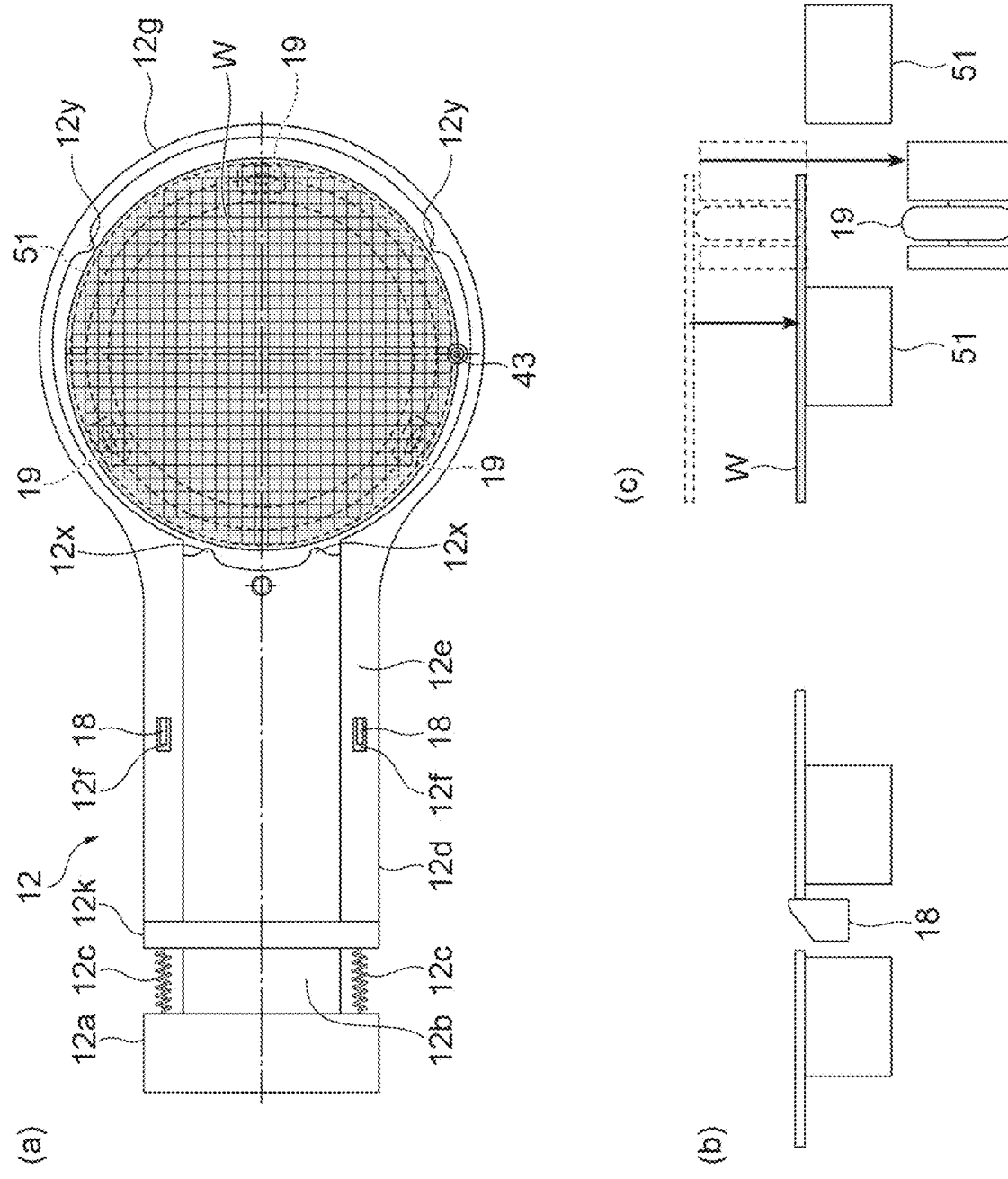
FIG. 13 is a diagram for illustrating a wafer conveyance step by the wafer chuck.

Subsequently, as shown in FIG. 13(*c*), under the control of the controller 50, the wafer holder 19 is lowered and the wafer W is placed on the wafer base 51. The wafer holder 19 retracts below the wafer base 51.

Figure 14:
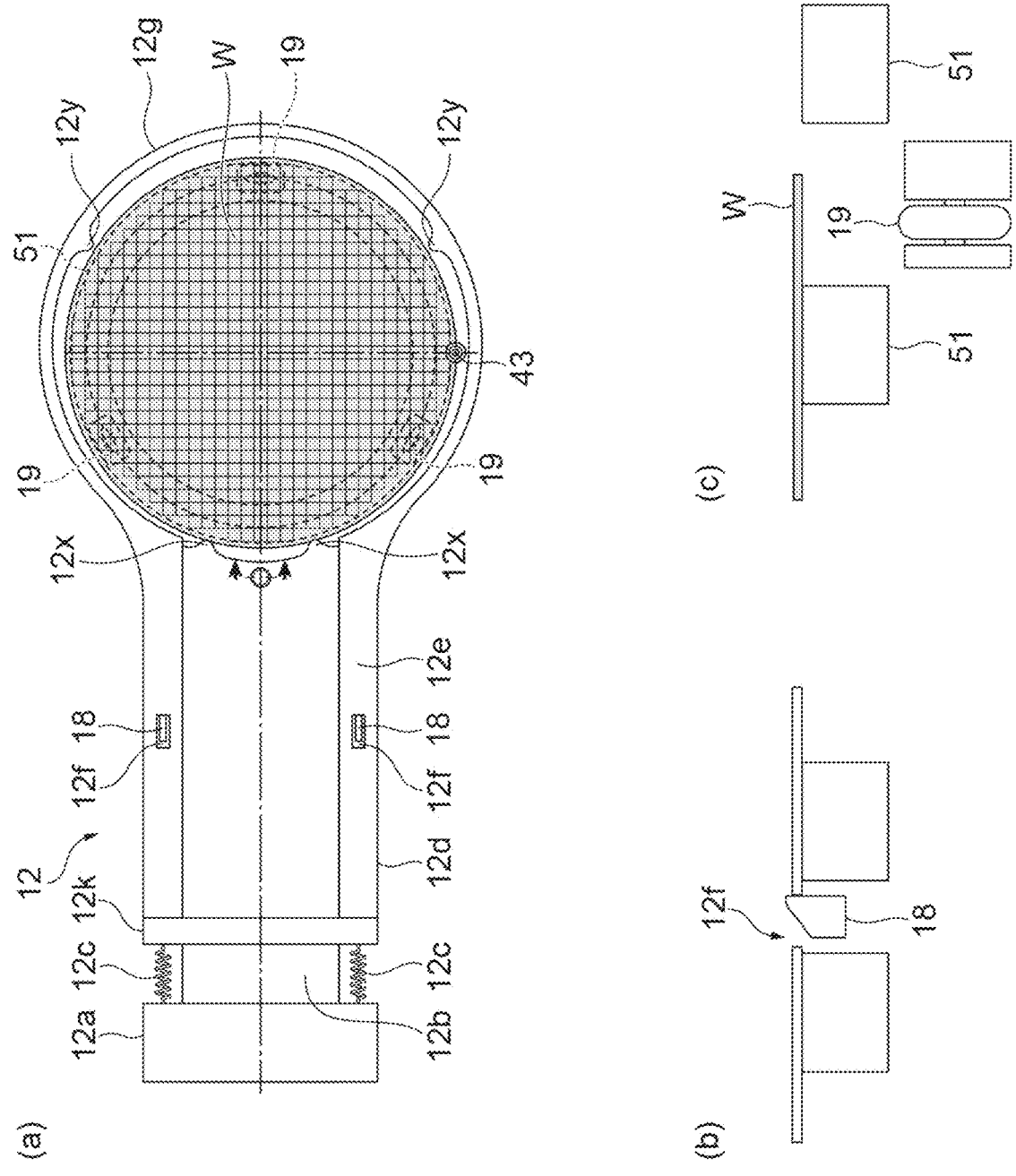
FIG. 14 is a diagram for illustrating a wafer conveyance step by the wafer chuck.

Subsequently, as shown in FIG. 14(*a*), under the control over the X stage 21 of the controller 50, the base portion 12*a* and the core portion 12*b* are moved in the X direction and the protruding portions 12*x* and 12*x* come into contact with the peripheral portion of the wafer W. It should be noted that in this state, the ratchet mechanisms 18 and 18 and the hole portions 12*f* and 12*f* of the wafer chuck 12 are engaged with each other (see FIG. 14(*b*)), whereby the movement of the ring portion 12*d* in the X direction is restricted.

Figure 15:
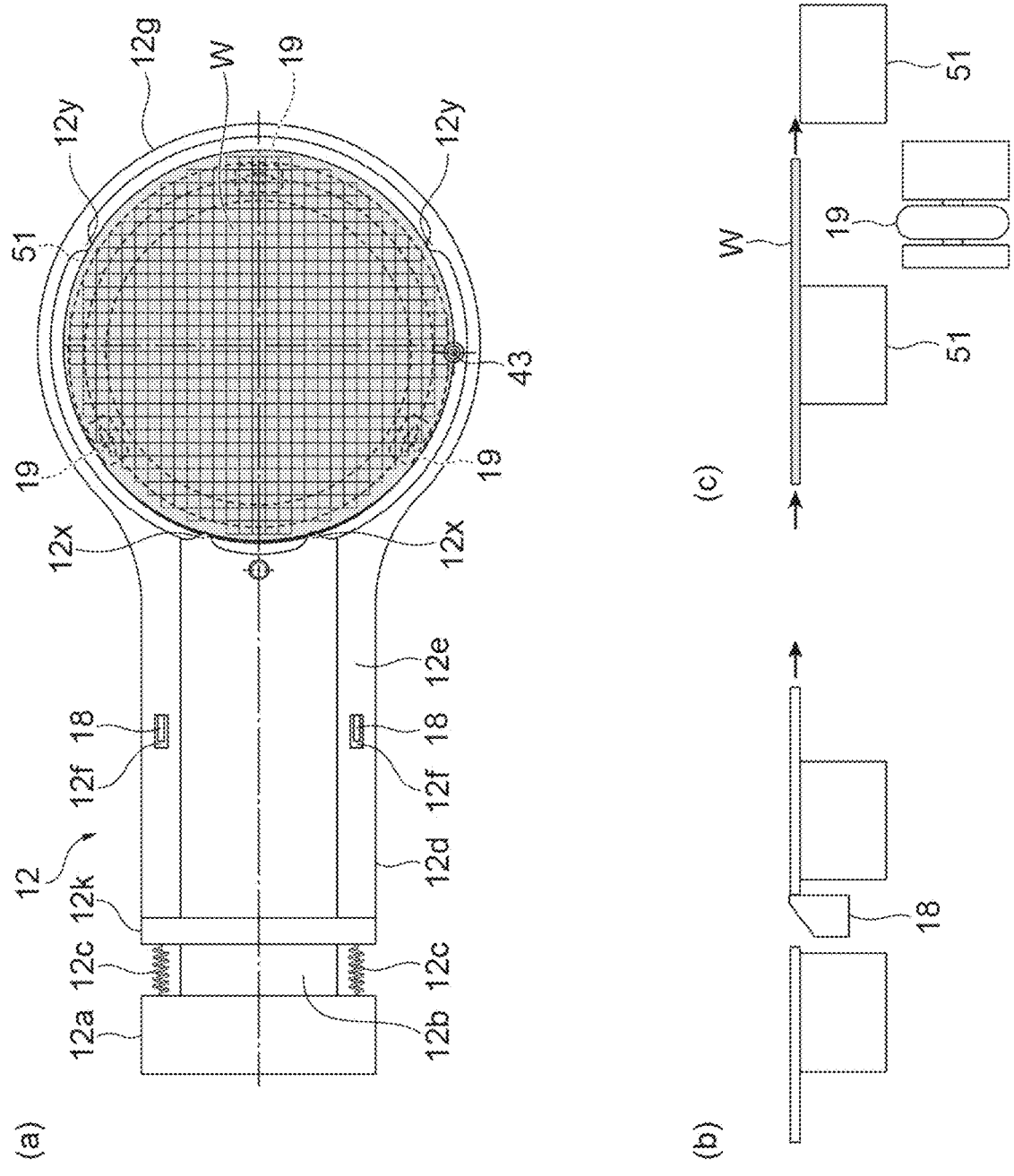
FIG. 15 is a diagram for illustrating a wafer conveyance step by the wafer chuck.

Subsequently, as shown in FIG. 15(*a*), under the control over the X stage 21 of the controller 50, the base portion 12*a* and the core portion 12*b* further move in the X direction, and the protruding portions 12*x* and 12*x* push the wafer W in the X direction, whereby the peripheral portion of the wafer W comes into contact with the protruding portions 12*y* and 12*y* of the ring portion 12*d*. The protruding portions 12*x* and 12*x* and the protruding portions 12*y* and 12*y* apply force to the wafer W from both sides and sandwich the wafer W, thereby fixing the wafer W during conveyance. Then, at this time point, force in the X direction starts to be applied to the ring portion 12*d*, and the engagement state between the ratchet mechanisms 18 and 18 and the hole portions 12*f* and 12*f* of the wafer chuck 12 is released as shown in FIG. 15(*b*). That is, the ring portion 12*d* is released from the ratchet mechanism 18.

Figure 16:
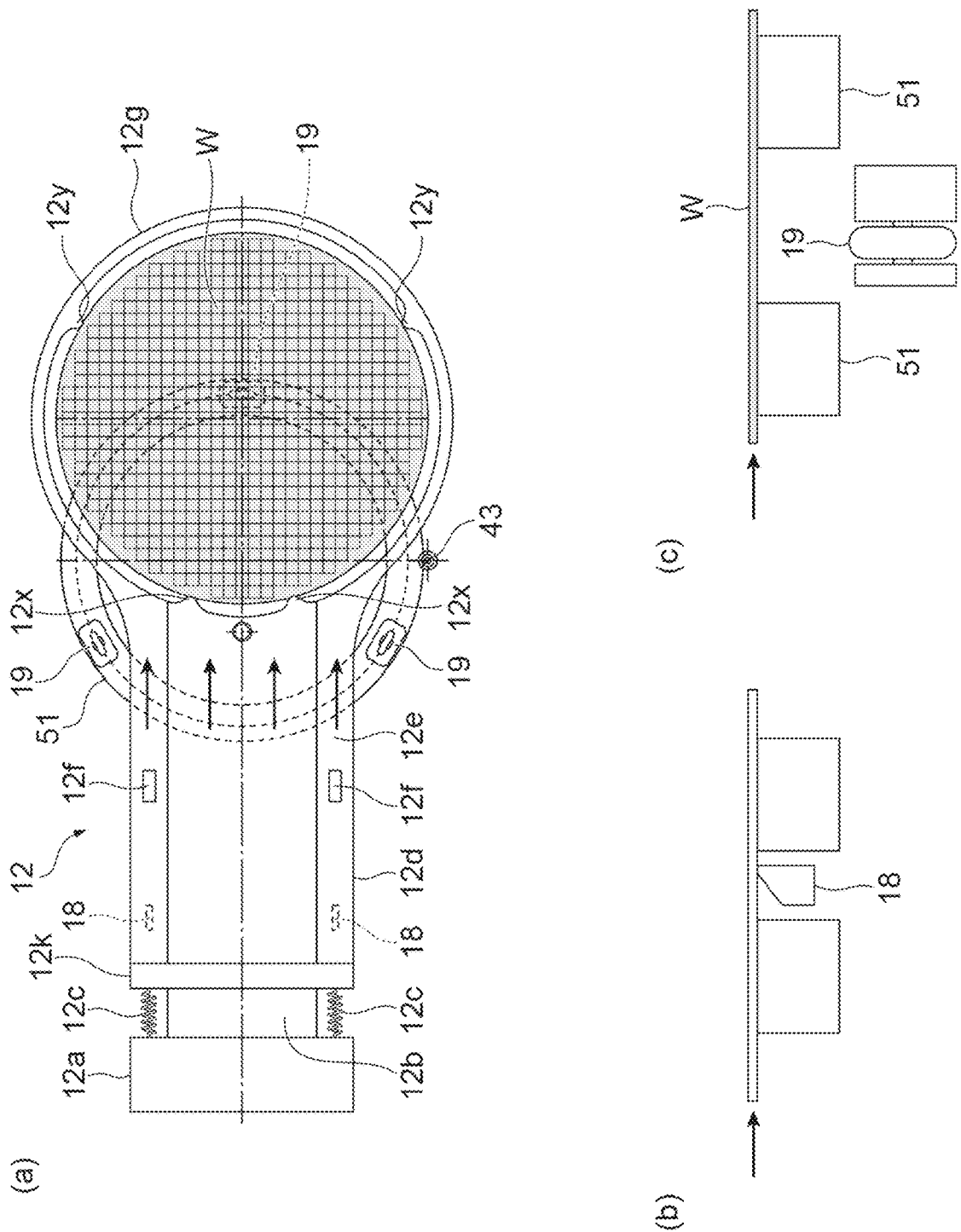
FIG. 16 is a diagram for illustrating a wafer conveyance step by the wafer chuck.

Then, in a state where the peripheral portion of the wafer W is sandwiched by the protruding portions 12*x*, 12*x*, 12*y*, and 12*y*, as shown in FIG. 16(*a*), the wafer chuck 12 moves in the X direction under the control over the X stage 21 of the controller 50. That is, the wafer chuck 12 is separated from the wafer base 51 and moves toward the placement table 11. The wafer W can be sandwiched from the left and right (both sides) by the elastic member 12*c* provided at the base of the wafer chuck 12.

Figure 17:
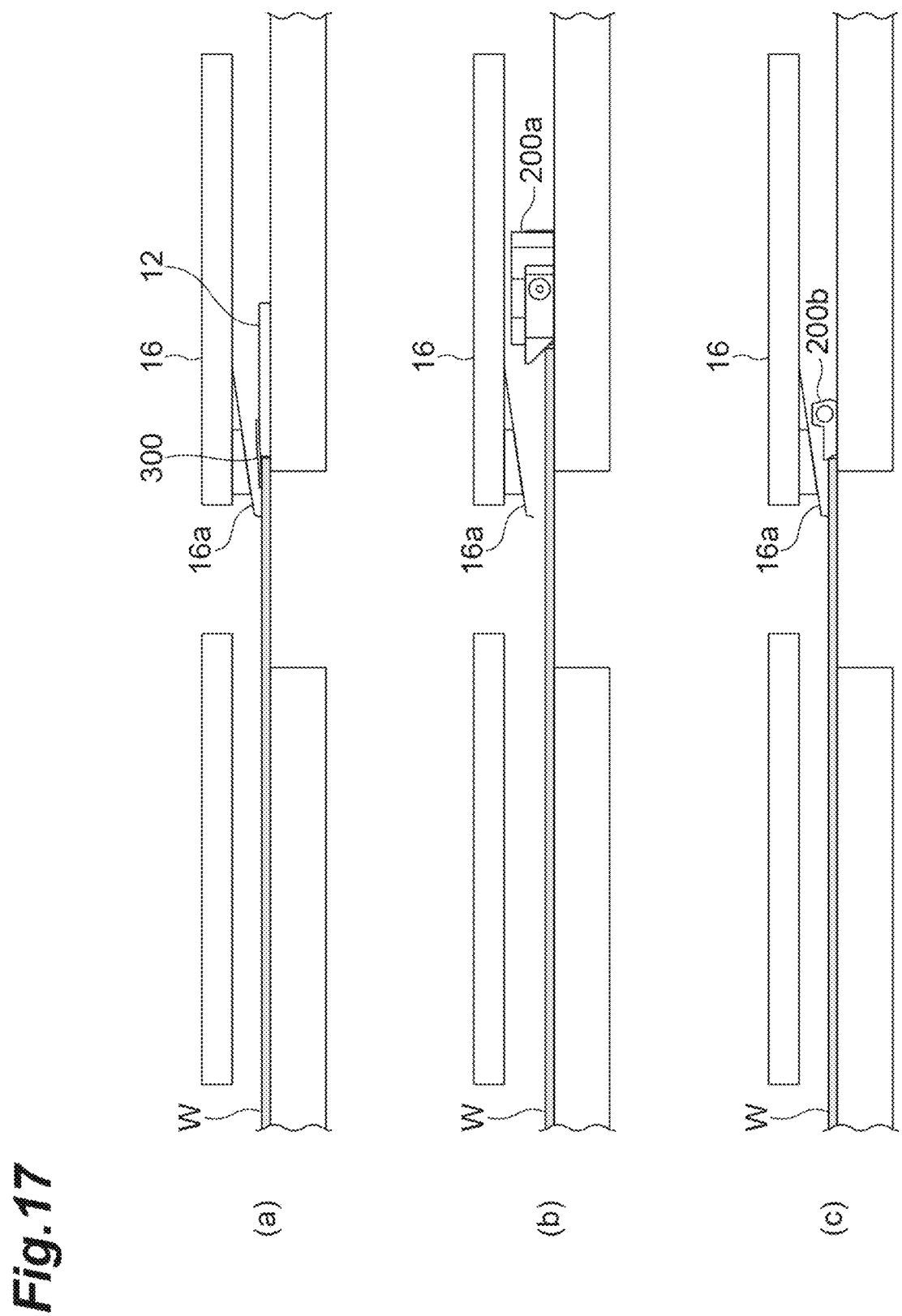
FIG. 17 is a diagram schematically showing a wafer fixing method according to a comparative example.

Next, functions and effects of the failure analysis unit 10 according to the present embodiment will be described while the configuration according to the comparative example is compared (see FIG. 17).

As a wafer conveyance mechanism in the failure analysis unit 10, a configuration including a wafer chuck 12 for placing and conveying a wafer W is known. As a method for firmly holding the wafer W on the wafer chuck 12, there is a method of fixing the front surface side of the wafer W to the wafer chuck 12 with a tape 300 as shown in FIG. 17(*a*). The tape 300 has a small height. Therefore, when the needle 16*a* of the probe card 16 is touched down on the pad of the wafer W from the front surface side of the wafer W, it is advantageous in that access to the chip near the wafer edge can be made. However, in recent years, there has been a case where a wafer W is moved from a wafer cassette 70 to a wafer chuck 12 by a wafer conveyance robot 60 in order to automatically perform failure analysis on a plurality of wafers W. However, when such a wafer conveyance robot 60 is used, it is difficult to adopt a method of fixing a wafer W to a wafer chuck 12 with a tape 300. Therefore, a configuration for firmly holding the wafer W during conveyance with a configuration other than the fixing with the tape 300 is required.

As such a configuration, for example, it is conceivable to adopt a configuration in which a fixture for firmly holding the wafer W during conveyance is provided on the front surface side of the wafer W. However, for example, as shown in FIG. 17(*b*), when the fixture 200*a* having a relatively large height is used, the height of the fixture 200*a* becomes larger than the height from the bottom surface of the probe card 16 to the tip of the needle 16*a*, and there is a possibility that the above-described touch-down becomes impossible. In addition, for example, as shown in FIG. 17(c), when the fixture 200b having a relatively small height is used, the touch-down is not disabled unlike the fixture 200a, but there is a possibility that interference occurs near the wafer edge depending on the design of the probe card 16. As described above, in the wafer conveyance mechanism, it is required to firmly hold the wafer W during conveyance by a method other than the tape, but when each function of the semiconductor failure analysis apparatus is to be achieved, the position, thickness, and the like of the holding means are limited, and an appropriate holding means has not been found.

As a configuration to solve the above-described problem, a failure analysis unit 10 according to the present embodiment is a wafer conveyance unit that conveys a wafer W while holding the wafer W in a semiconductor failure analysis apparatus, and includes a placement table 11 that fixes the wafer W to a predetermined observation position, and a wafer chuck 12 that conveys the wafer W while holding the wafer W to the observation position. The wafer chuck 12 includes a plurality of holding members (protruding portions 12x, 12x, 12y, and 12y) provided so as to face a side surface of the wafer W, and holds the wafer W by sandwiching a peripheral portion of the wafer W with the plurality of holding members.

In the failure analysis unit 10 according to the present embodiment, the wafer W is conveyed by the wafer chuck 12 to the observation position to which the wafer W is fixed. Then, the wafer chuck 12 sandwiches the peripheral portion of the wafer W with the plurality of protruding portions 12x, 12x, 12y, and 12y provided to face the side surface of the wafer W. As described above, by adopting the configuration in which the protruding portions 12x, 12x, 12y, and 12y of the wafer chuck 12 sandwiches the peripheral portion of the wafer W from the side surface of the wafer W, it is not necessary to provide a new configuration for firmly holding the wafer W during conveyance on the back surface side and the front surface side of the wafer W. This makes it possible to appropriately hold the wafer W during conveyance without hindering each function of the semiconductor failure analysis apparatus.

The plurality of holding members may include at least four protruding portions 12x, 12x, 12y, and 12y. Thus, the wafer W can be more stably sandwiched.

The plurality of holding members may include: a first holding member including a plurality of protruding portions 12y and 12y configured to abut on a peripheral portion of the wafer W, and a second holding member including a plurality of the protruding portions 12x and 12x. A direction of a force applied to the wafer W by the first holding member configured to sandwich the wafer W and a direction of a force applied to the wafer W by the second holding member configured to sandwich the wafer W may be opposite to each other. Since the direction of the force applied to the wafer W by the first holding member and the direction of the force applied to the wafer W by the second holding member are opposite to each other, the wafer W can be appropriately sandwiched by the first holding member and the second holding member.

The failure analysis unit 10 described above may further include a ratchet mechanism 18 configured to change a separation distance between the first holding member and the second holding member by fixing a position of only the first holding member, the ratchet mechanism 18 configured to release a sandwiching state of the wafer W by the first holding member and the second holding member. According to such a configuration, with a simple configuration in which the position of only the first holding member is fixed, the sandwiching state of the wafer W can be appropriately released (the wafer W can be opened).

The wafer chuck 12 may include: a base portion 12a; a ring portion 12d including: a first portion 12k connected to the base portion 12a via an elastic member 12c, a pair of second portions 12e and 12e continuous with the first portion 12k and extending in the X direction while facing each other, and a third portion 12g continuous with tips of the pair of second portions 12e and formed in a ring shape so as to partition a housing space for housing a wafer; and a core portion 12b continuous with the base portion 12a and extending in the X direction between the pair of second portions 12e and 12e. The third portion 12g of the ring portion 12d may be provided with the protruding portions 12y and 12y protruding toward the housing space. A tip of the core portion 12b may be provided with the protruding portions 12x and 12x protruding toward the housing space. A hole portion 12f configured to be engaged with the ratchet mechanism 18 may be formed in the pair of second portions 12e of the ring portion 12d. The ratchet mechanism 18 may engage with the hole portion 12f to fix a position of the ring portion 12d to fix positions of the protruding portions 12y and 12y. According to this configuration, the wafer W is appropriately sandwiched between the protruding portions 12y and 12y and the protruding portions 12x and 12x protruding toward the housing space. Then, the hole portions 12f of the pair of second portions 12e of the ring portion 12d are engaged with the ratchet mechanism 18, whereby the ring portion 12d is fixed and the positions of the protruding portions 12y and 12y are fixed. In this case, since the ring portion 12d and the base portion 12a are connected via the elastic member 12c, the base portion 12a and the core portion 12b continuous with the base portion 12a can be displaced even in a state where the position of the ring portion 12d is fixed by extension of the elastic member 12c. Displacement of the core portion 12b in a direction away from the housing space in a state where the position of the ring portion 12d is fixed causes the separation distance between the protruding portions 12y and 12y provided in the ring portion 12d and the protruding portions 12x and 12x provided in the core portion 12b to increase, and the sandwiching state of the wafer W by the protruding portions 12y and 12y and the protruding portions 12x and 12x to be released. As described above, with the above-described configuration, it is possible to easily perform appropriate sandwiching and releasing (opening) of the wafer W. In addition, the chuck/unchuck of the wafer is achieved by the motion of the X stage, and another chuck/unchuck driving mechanism does not need to be provided. Thus, reliability as a wafer load/unload system can be improved.

Figure 18:
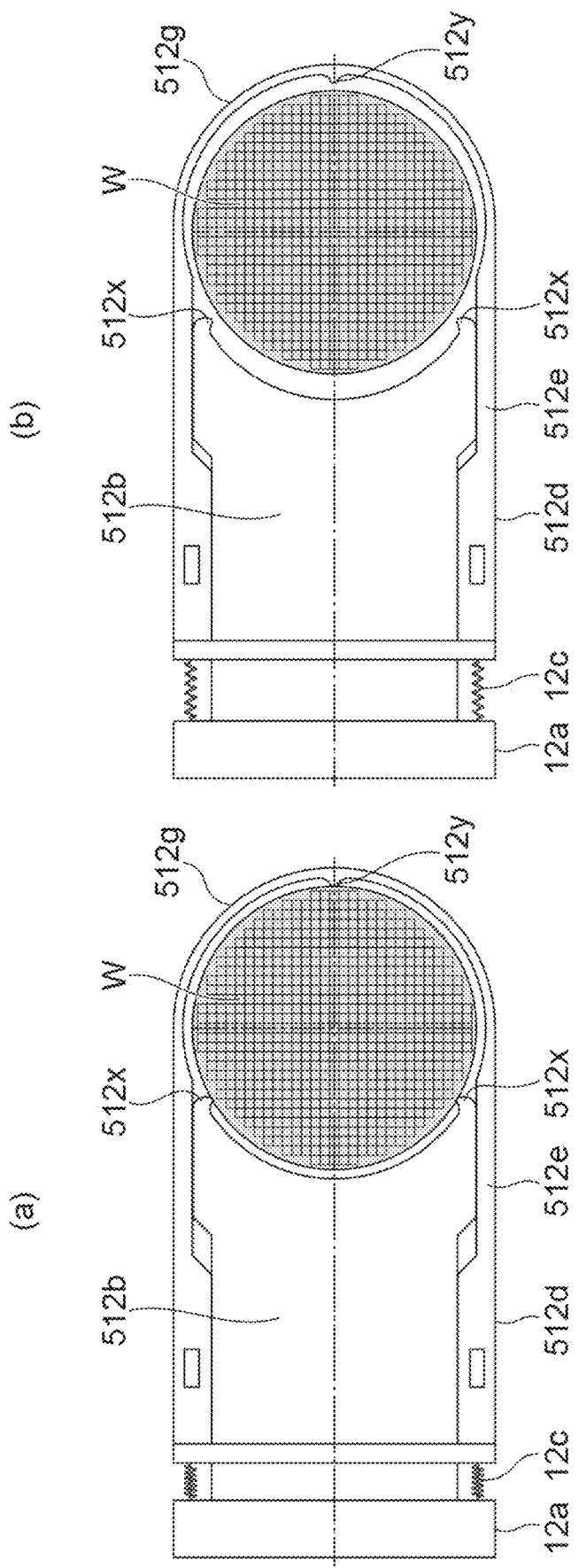
FIG. 18 is a diagram schematically showing a wafer chuck according to a modification.

Although the embodiments of the present invention have been described above, the present invention is not limited to the above embodiments. For example, in the above embodiments, it has been described that at least four protruding portions are provided as the holding member, but the number of protruding portions may be three as shown in FIG. 18. That is, in the wafer chuck shown in FIGS. 18(a) and 18(b), two protruding portions 512x and 512x are provided at the tip of the core portion 512b, and one protruding portion 512y is provided in the third portion 512g of the ring portion 512d. The positions where the protruding portions 512x, 512x, and 512y are provided are not particularly limited, but for example, the positions where the protruding portions 512x and 512x are provided are outside the positions where the protruding portion 512y is provided in the Y direction.

REFERENCE SIGNS LIST 10 failure analysis unit (wafer conveyance unit)
11 placement table (fixing unit)
12 wafer chuck (conveyance unit)
12a base portion
12b core portion
12c elastic member
12d ring portion
12e second portion
12f hole portion
12g third portion
12k first portion
12x, 12x, 12y, 12y protruding portion
18 ratchet mechanism (ratchet portion)
19 wafer holder
21 X stage
22 Y stage
40 performance board
41 connector board
42 pogo tower
43 notch sensor
50 controller
51 wafer base
60 wafer conveyance robot
61 hand
70 wafer cassette
80 solid immersion lens
200a, 200b fixture
300 tape
512b core portion
512d ring portion
512x protruding portion
512y protruding portion
W wafer

The invention claimed is:

1. A wafer conveyance unit configured to convey a wafer while holding the wafer in a semiconductor failure analysis apparatus, the wafer conveyance unit comprising:
a fixing unit configured to fix a wafer at a predetermined observation position; and
a conveyance unit configured to convey the wafer to the observation position while holding the wafer, the conveyance unit including:
a plurality of holding members provided so as to face a side surface of the wafer and holding the wafer by sandwiching a peripheral portion of the wafer with the plurality of holding members; and
a ring portion that partitions a housing space for housing the wafer,
wherein the ring portion is provided with the plurality of holding members that protrude toward the housing space, and
wherein the plurality of holding members comprise:
a first holding member comprising one or a plurality of protruding portions configured to abut on a peripheral portion of the wafer, and
a second holding member spaced from the first holding member and comprising one or a plurality of the protruding portions, and
wherein a direction of a force applied to the wafer by the first holding member configured to sandwich the wafer and a direction of a force applied to the wafer by the second holding member configured to sandwich the wafer are opposite to each other.

2. The wafer conveyance unit according to claim 1, wherein the plurality of holding members comprise at least three of protruding portions configured to abut on a peripheral portion of the wafer.

3. The wafer conveyance unit according to claim 2, wherein the plurality of holding members comprise at least four of the protruding portions.

4. The wafer conveyance unit according to claim 1, further comprising a ratchet portion configured to change a separation distance between the first holding member and the second holding member by fixing a position of only one of the first holding member and the second holding member, the ratchet portion configured to release a sandwiching state of the wafer by the first holding member and the second holding member.

5. The wafer conveyance unit according to claim 4, wherein the conveyance unit comprises:
a base portion,
the ring portion comprising:
a first portion connected to the base portion via an elastic member,
a pair of second portions continuous with the first portion and extending in a first direction while facing each other, and
a third portion continuous with tips of the pair of second portions and formed in a ring shape so as to partition the housing space for housing the wafer, and
a core portion continuous with the base portion and extending in a first direction between the pair of second portions,
wherein the third portion of the ring portion is provided with the first holding member protruding toward the housing space,
wherein a tip of the core portion is provided with the second holding member protruding toward the housing space,
wherein a hole portion configured to be engaged with the ratchet portion is formed in the pair of second portions of the ring portion, and
wherein the ratchet portion engages with the hole portion to fix a position of the ring portion to fix a position of the first holding member.

6. A wafer conveyance method for conveying a wafer while holding the wafer in a semiconductor failure analysis apparatus, the method comprising:
providing a conveyance unit including a ring portion that partitions a housing space for housing the wafer, the ring portion having a plurality of holding members that protrude toward the housing space;
sandwiching a peripheral portion of the wafer with the plurality of holding members provided to face a side surface of the wafer; and
conveying the wafer to a predetermined observation position in a state where the peripheral portion of the wafer is sandwiched by the plurality of holding members,
wherein the plurality of holding members comprise:
a first holding member comprising one or a plurality of protruding portions configured to abut on a peripheral portion of the wafer, and
a second holding member spaced from the first holding member and comprising one or a plurality of the protruding portions, and
wherein a direction of a force applied to the wafer by the first holding member configured to sandwich the wafer and a direction of a force applied to the wafer by the second holding member configured to sandwich the wafer are opposite to each other.

* * * * *